(12) United States Patent
Kida

(10) Patent No.: US 6,171,350 B1
(45) Date of Patent: Jan. 9, 2001

(54) APPARATUS FOR MOUNTING ELECTRONIC PARTS TO A MOUNTING BODY

(75) Inventor: Tomoyuki Kida, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 08/277,013

(22) Filed: Jul. 19, 1994

(30) Foreign Application Priority Data

Jul. 19, 1993 (JP) .................................................... 5-177787

(51) Int. Cl.$^7$ .............................. H01L 21/00; H01L 21/64
(52) U.S. Cl. ............................................................. 29/25.01
(58) Field of Search ............................................ 29/25.01

(56) References Cited

FOREIGN PATENT DOCUMENTS 3-3959    1/1991  (JP) .

*Primary Examiner*—David E. Graybill
(74) *Attorney, Agent, or Firm*—Young & Thompson

(57) ABSTRACT

An apparatus that performs a process wherein the lines representing the lead rows on the four sides, respectively, of an electronic part 322 are calculated. The diagonals of the rectangle formed from these lines and the intersection angle between these diagonals are used as the base lines and base point of the electronic part. Likewise the lines representing the outer-end rows of the bonding pads of p.c. board 320 are calculated. The diagonals of the rectangle defined by these lines and the intersection angle between these diagonals are used as the base lines and base point of the p.c. board. Subsequently correction of the angle and position is carried out based on the corrective amounts of the average intersection angle $\theta_e$ between both base lines and the coordinate differences $X_e$ and $Y_e$ between both base points to align precisely electronic part 322 with p.c. board 320, thus the implementation being possible to be completed.

7 Claims, 7 Drawing Sheets

APPARATUS FOR MOUNTING ELECTRONIC PARTS TO A MOUNTING BODY

BACKGROUND OF THE INVENTION

1. Field of the Invention

The present invention relates to an mounting system and a method for mounting electronic parts and, more particularly, to a mounting system and a method for mounting QFP (quad-flat-package) semiconductor integrated circuit devices on a printed circuit board, a test socket, or the like.

2. Background of the Invention

Although a electronic part such as semiconductor integrated circuit device is mounted on a mounting body such as a printed circuit board and a test socket by an automatic mounting system, alignment therebetween has become an important problem. That is, a number of leads coming out of the electronic part must be precisely in contact with the corresponding terminals on the board without making short-circuiting any other terminals. In recent years, electronic parts carry thereon leads increasing in number and correspondingly narrower in pitch between them.

Generally, since an electronic part is attracted by an attraction arm and carried and then mounted on a board, there is misalignment between the mutual positions thereof, and hence the correction is needed to precisely align the mutual positions thereamong.

In such circumstances, for example, as disclosed in Japanese Patent Publication No. Hei.3-3959, the differences in position between some selected leads of the electronic part and the corresponding bonding terminals on the p.c. board are detected, and based on the thus-obtained data the misalignment is corrected.

Referring to FIG. 9, the conventional implementation technique will be set forth. The whole optical images of a printed circuit board 320 and an electronic part 322 carried by an attraction arm 321 are formed by cameras 311a, 311b, respectively, and put into a printed circuit board position recognizer 312a and an electronic-part (QFP) position recognizer 312b, respectively, each being stored in the memory address as a set of points in absolute coordinate system.

FIG. 10 shows the plan views of the printed circuit board and the electronic part represented in the X-Y coordinate system. The QFP recognizer 312b selects the three leads 351 to 353 at one ends of the three selected sides, respectively, of the electronic part 322 and stores therein their free-end-center coordinates as the first to third position data 314a to 314c.

On the other hand, the printed circuit board recognizer 312a detects, from the optical image of the printed circuit board 320 sent thereto, the center coordinates of the first to third bonding positions at which the free ends of the first to third leads 351 to 353 are to be bonded, and stores them therein as the data of the first to third bonding positions 313a to 313c.

Next, the data of the first and second lead positions 314a, 314b and the first and second bonding positions 313a, 313b are put into an angle arithmetic section 315 where as the rotation angle of the attraction arm, $\theta_A$ is calculated by the following equation (1) as expressed:

$$\theta_A = \tan^{-1}\{(y_{361}-y_{362})/(x_{361}-x_{362})\} - \tan^{-1}\{(y_{351}-y_{352})/(x_{351}-x_{352})\} \quad (1)$$

where $(x_{351}, y_{351})$ and $(x_{352}, y_{352})$ are the coordinates of the first and second leads, respectively; and $(x_{361}, y_{361})$ and $(x_{362}, y_{362})$ are the coordinates of the first and second bonding positions, respectively.

The obtained angle $\theta_A$ is outputted as it is to the outside and further put into a base-point arithmetic section 316 which computes the coordinate $(x_{371}, y_{371})$ of the first lead when the electronic part has been $\theta_A$ rotated by attraction arm 321, which is used as the first base point. The first base point is calculated, letting $(x_c, y_c)$ be the coordinate of the bonding position and $(Dx_{1c}, Dy_{1c})$ be the differences in X- and Y-directions between the bonding position to the first lead, by the following equation (2):

$$x_{371} = x_c - Dx_{1c}\cos\theta_A + Dy_{1c}\sin\theta_A$$

$$x_{371} = y_c - Dy_{1c}\cos\theta_A - Dx_{1c}\sin\theta_A \quad (2)$$

The coordinates $(x_{372}, y_{372})$ $(x_{373}, y_{373})$ of the second and third base points, respectively, corresponding to the second and third leads are obtained in the same way as the coordinate of the first base point.

The coordinate data 317a, 317b of the first and second base points, and the coordinates 313a, 313b of the first and second bonding positions are put into a $Y_A$ arithmetic section 319. Additionally the coordinate data 317c and 313c of the third base point and the third bonding position are put into an $X_A$ arithmetic section 318. Thus corrective amounts $Y_A$ and $X_A$ are obtained by the following equations (3) and (4):

$$Y_A = \{(y_{361}-y_{371})+(y_{362}-y_{372})\}/2 \quad (3)$$

$$X_A = x_{363} - x_{373} \quad (4)$$

The resulting corrective amounts $X_A$ and $Y_A$ are outputted from the arithmetic sections to the outside world.

Electronic part 322 is adjusted in angle based on the aforesaid angle $\theta_A$, and in position by corrective amounts $X_A$ and $Y_A$, and whereby the lead free-ends of the electronic part can be aligned correctly with the corresponding bonding position of the P.C. board.

In the above-mentioned conventional implementation technique for electronic parts, the positional correction is made only the three specified leads of an electronic part to be bonded as base leads, and hence deformation of them within the allowable range may cause a problem that correct positioning for mounting the electronic part is impossible.

FIGS. 11(a) and 11(b) shows as an example an electronic part with all leads having a length of 3 mm and some of them deformed. An implementation-allowable range from the design value between the free-end of the lead and the corresponding bonding position on the P.C. board is set to ±0.15 mm. As shown in FIG. 11(a), the first to third selected leads 351b, 353b, and the fourth lead (end lead) 300 at the opposite end to the third lead, get slightly inclined. Furthermore it is assumed that in P.C. board 320 on which the electronic parts are mounted the bonding positions are ideally formed.

FIG. 11(b) represents the inclined selected-leads and their coordinates. The first lead 351b has a coordinate of (110, 43.5) at the root center and an inclination of +0.1 mm in Y-direction. Thus the coordinate of the free-end center is (113, 43.6). The second lead 352b has a coordinate of (110, 43.5) at the root center, and an inclination of −0.1 mm in Y-direction. Thus the coordinate of the free-end center is (87, 43.6). The third lead 353b has a coordinate of (90.5, 57) at the root center and is inclined by −0.1 mm with respect to X-direction. It therefore has a coordinate (90.4, 60) at the free-end center. The fourth lead 300 has a coordinate of (100.5, 57) at the root center, and is inclined by +0.1 mm with respect to X-direction. It therefore has a coordinate (109.6, 60) at the free-end center.

On the other hand, in the printed circuit board 320 the center coordinates of the first to third bonding positions 351*b*, 352*b*, 353*b*, and the fourth bonding position corresponding to the fourth lead 300 are (113, 43.5), (87, 43.5), (90.5, 60), and (109.5, 60), respectively. By substituting the above-mentioned values into the above-mentioned equations (1) to (4), we obtain an corrective amount of angle $\theta_A = 0.44$. Additionally are obtained the first, second, and third base points (112.95, 43.5), (86.95, 43.5), and (90.48, 60.07), respectively; and the position-corrective amount $Y_A = 0$ and $X_A = 0.02$.

All the first to third base points are within the allowable range for implementation of ±0.15 mm in both X- and Y-direction with respect to the first to third bonding positions. The free-end center of the fourth lead 300 has a coordinate (109.7, 59.27) after the corrective rotation, and accordingly are largely out of the allowable range for implementation by as much as 0.2 mm in X-direction and 0.73 mm Y-direction with respect to the corresponding bonding position.

The electronic part 322 shown in FIG. 11(*b*), all the leads of which get deformed within the allowable range, and hence from this viewpoint should be mounted correctly by virtue of implementation system. As described above, however, the conventional implementation technique can not always mount correctly on a P.C. board an electronic part if the leads selected for calculation of the base points and angle get inclined, and this has become the cause of resulting in rejected implementation by the conventional electronic-part implementation system.

SUMMARY OF THE INVENTION

Therefore, it is an object of the present invention to provide an mounting system and a method of mounting in which the precise mounting of an electronic part on a board is carried out even when the part has bent leads.

A mounting system for an electronic part according to the present invention comprises a positional-data forming means for forming positional data of the leads of the electronic part and of the bonding positions on a mounting body, line arithmetic means for calculating from the positional data lead lines representing the rows of the leads of the electronic part and bonding lines corresponding to the lead lines and representing the rows of the bonding positions, arithmetic means for calculating the base points and base lines of the electronic part based on the lead lines and the base points and base lines of the printed circuit board based on the bonding lines; position/angle arithmetic means for calculating the positional interrelationship between base points of the electronic part and the printed circuit board, and the intersection angles between base lines of the electronic part and the printed circuit board, respectively; and position/angle control means for controlling interrelationship in position and angle between the electronic part and the printed circuit board, based on the positional interrelationship and the intersection angles.

A mounting method according to the present invention comprises the steps of forming the positional data of the leads of an electronic part and the bonding positions of a mounting body, calculating from the positional data the lead lines representing the rows of the leads in each direction and the bonding lines corresponding to the lead lines and representing the rows of the bonding positions, calculating the base point and base lines of the electronic part based on the lead lines and the base point and base lines of the printed circuit board based on the bonding lines, calculating the positional interrelationship between base points of the electronic part and the printed circuit board, and the intersection angles between base lines of the electronic part and the p.c. board; and controlling interrelationship in position and angle between the electronic part and the p.c. board, based on the positional interrelationship and the intersection angle.

The base point and base lines of the electronic part and the mounting body, respectively, defined by the lead lines and bonding lines representing the rows of selected leads and the selected bonding positions, respectively, would change not so much by deformation of the leads and bonding positions or misalignment. It is therefore possible to accomplish precise implementation of electronic parts by controlling the relative position and angle between the electronic part and the mounting body according to corrective amounts obtained based on these base points and base lines.

BRIEF DESCRIPTION OF THE DRAWINGS

The above and other objects, features and advantages will be more apparent from the description of the present invention taken in conjunction with the accompanying drawings.

DETAILED DESCRIPTION OF THE EMBODIMENTS

Figure 1:
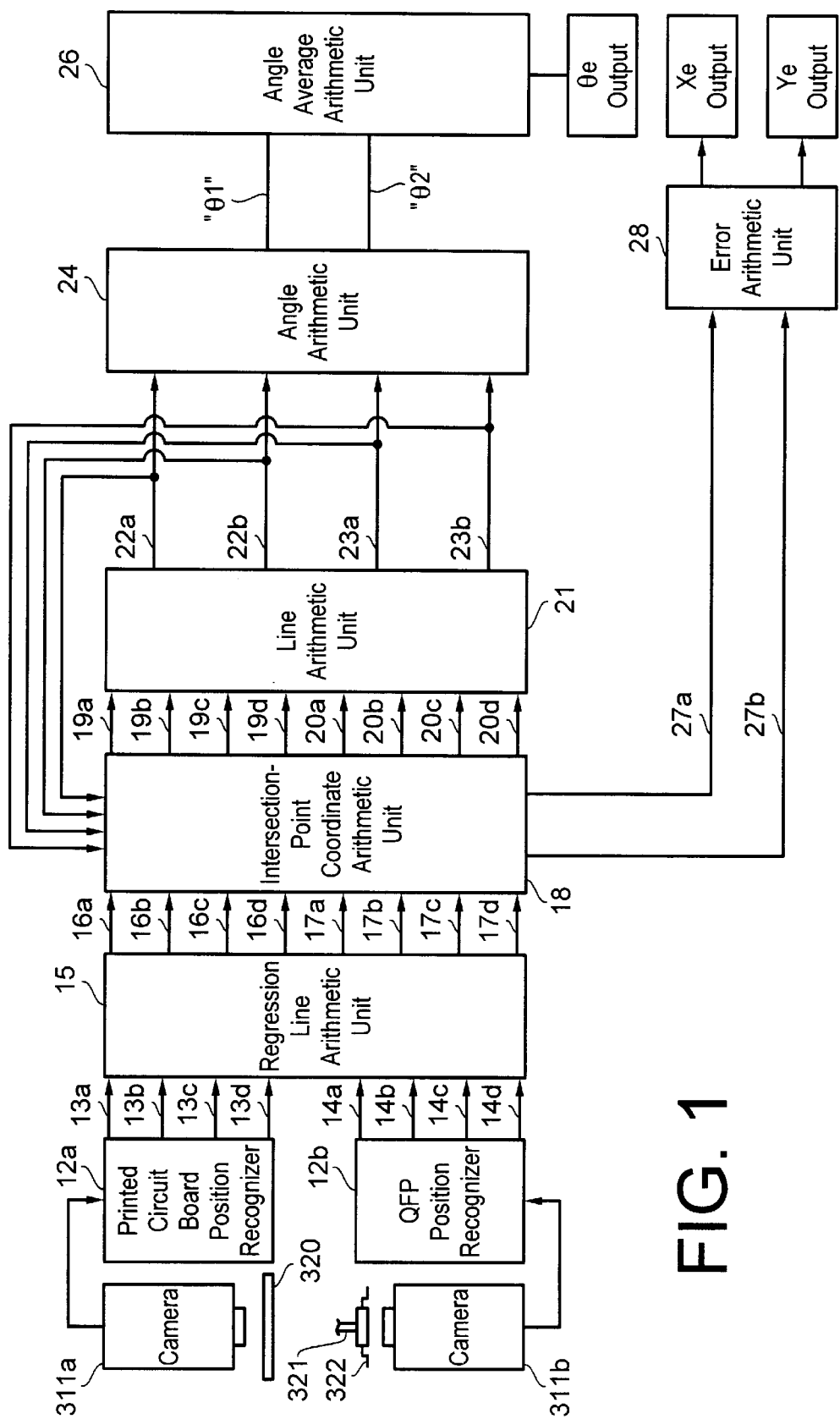
FIG. 1 is a block diagram showing the construction of a mounting system for an electronic part according to a first embodiment of the present invention.

Reference is made to FIG. 1 showing a block diagram illustrating a mounting system for electronic parts as the first embodiment of the present invention. An electronic part 322 as a QFP integrated circuit is held by an attraction arm 321. This electronic part 322 has leads arranged on the respective four sides thereof and mounted on a printed circuit board 320 as a mounting body.

In this system, cameras 311*a*, 311*b* take whole optical images of P.C. board 320 and electronic part 322, respectively. P.C. board recognizer 12*a* retrieves measurement windows 13a to 13d on p.c. board 320 from the output signals of the corresponding camera 311a and outputs as positional data a set of specific, i.e., center coordinates of the lead free-ends, and correspondingly electronic part (QFP) recognizer 12b retrieves measurement windows 14a to 14d of electronic part 322 from the output signals of camera 311b, and outputs as positional data a set of specific, i.e., the center coordinates of the bonding pad outer-end positions.

Regression-line arithmetic unit 15 calculates regression lines 16a to 16d, 17a to 17d from the sets of coordinates of retrieved measurement windows of the printed circuit board 320 and electronic part 322, respectively. Intersection-point coordinate arithmetic unit 18 calculates, for the printed circuit board 320 and the electronic part 322, respectively, intersection points 19a to 19d, 20a to 20d between four regression lines 16a to 16d, 17a, 17d obtained by the regression-line arithmetic unit 15; and intersection points 27a to 27d as base points from base lines 22a, 22d, 23a, 23d obtained by the later-described regression-line arithmetic unit 15.

Line arithmetic unit 21 calculates, for the printed circuit board and electronic part, respectively, two base lines 22a, 22b; 23a, 23b passing the intersection points between regression lines 15a to 15d, 16a to 16d obtained by the intersection-coordinate arithmetic unit 18. An angle arithmetic unit 24 calculates angles $\theta_1$, $\theta_2$ formed by the corresponding base lines 22a, 23a; 22b, 23b between the printed circuit board 320 and the electronic part 322.

An angle-average arithmetic unit 26 calculates a corrective angle $\theta_e$ from the average of two outputs of the angle arithmetic unit 24. An error arithmetic unit 28 calculates corrective distances $x_e$ and $y_e$ in X- and Y-directions corresponding to the distances between the base points 27a, 27b.

Based on output of $\theta_e$ of the angle-average arithmetic unit 26 and $x_e$ and $y_e$ of the error arithmetic unit 28, the electronic part is rotated and moved by a manipulator (not shown) to bring into alignment between the free-ends of each lead and the corresponding bonding position on the printed circuit board.

Figure 2A:
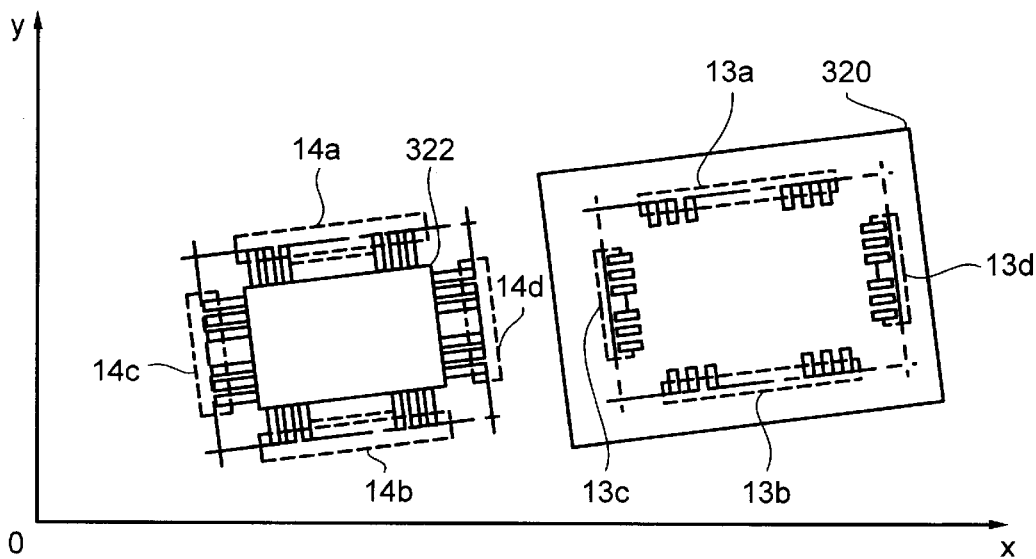
FIGS. 2(*a*) and 2(*b*) are plan views showing in detail the optical images of an electronic part and a printed circuit board, respectively, for illustrating the process of the first embodiment.
Figure 2B:
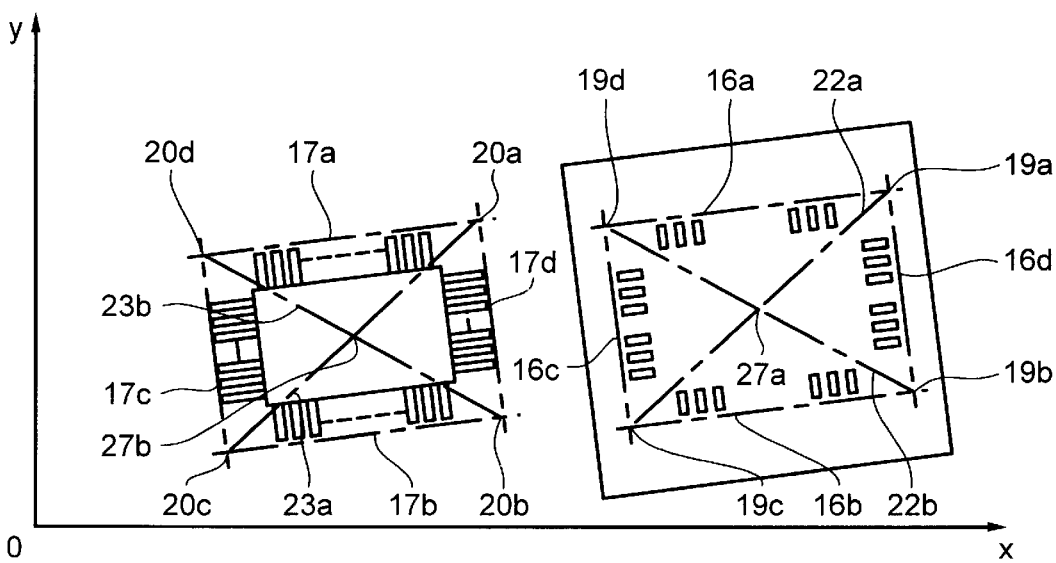

FIGS. 2(a) and 2(b) show in plan of the electronic part and p.c. board, respectively, for illustrating how they are processed by the implementation system in above-mentioned embodiment. As shown, the electronic part 322 is rectangular with each side having a row of leads projecting perpendicularly thereto, and the P.C. board is similarly rectangular and has the corresponding row of pads on each side to the row of leads. Referring to FIGS. 1 and 2, the practical processing procedure will be described hereinafter.

The electronic part 322 carried by the attraction arm is photographed by a camera 311b and put into a QFP recognizer 12b which retrieves from the input image data the center coordinates of all lead free-ends in the four separate windows 14a to 14d on the four sides, respectively. The obtained coordinates of the lead free-ends are put into regression-line arithmetic section 15 as the first to fourth windows 14a to 14d.

Additionally, a board recognizer 12a retrieves, for measurement windows 13a to 13d on the four sides of the printed circuit board 320 corresponding to the lead measurement windows 14a, 14d on the four sides, the center coordinates of the bonding pad-outer ends from the optical image of the printed circuit board 320 put-in from camera tube 311a. The obtained coordinates in the windows are similarly put into regression line arithmetic section 15 as the first to fourth windows 13a to 13d.

Figure 3:
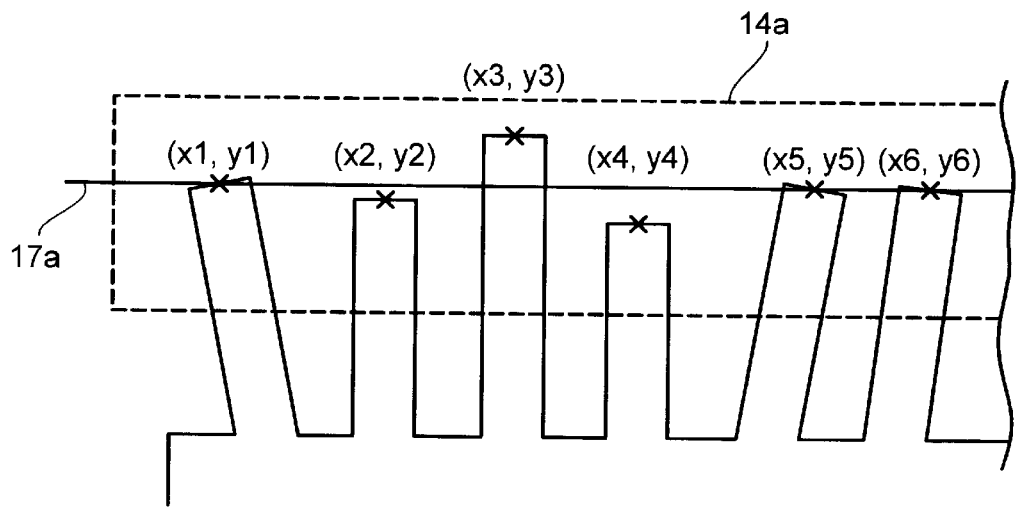
FIG. 3 is a schematic diagram for illustrating in detail a fragmentary lead row.

The regression arithmetic unit 15 calculates in each window of both the board 320 and the electronic part 322, regression line 16a to 16d; 17a 17d. FIG. 3 shows a way to calculate the regression lines in one window 14a of electronic part 322, assuming that some of the leads therein get inclined or deformed. As shown, regression line 17a is calculated based on the center coordinate $(x_i, y_i)$ of each lead free-end.

Regression line 17a is calculated by the following equation (5):

$$y = a + bx \quad (5)$$

$$a = \left(\sum_{i=1}^{n} y_i\right)/n - b \cdot \left(\sum_{i=1}^{n} x_i\right)/n$$

$$b = \left(\sum_{i=1}^{n} x_i \cdot y_i - \left(\sum y \cdot \sum x\right)/n\right) / \left\{\sum_{i=1}^{n} x_i^2 - \left(\sum_{i=1}^{n} x_i\right)^2/n\right\}$$

where n is the number of coordinate points in a window.

The regression-line arithmetic unit 15 calculates, for the board 320 and the electronic part 322, respectively, the regression line of each window in sequence according to the equation (5), stores them as the first and fourth bonding lines 16a to 16d and the first to fourth lead lines 17a to 17d, and supplies them to the intersection-coordinate arithmetic unit 18 which in turn calculates intersection points 19a to 19d; 20a to 20d between the regression lines of p.c. board 320 and electronic part 322, respectively.

For example, in FIG. 2(b) assuming that the first bonding line 16a is expressed by $Y=A_1+B_1 \cdot X$ and the fourth bonding line 16d by $Y=A_4+B_4 \cdot X$, the coordinate $(C_{x1}, C_{y1})$ of the first bonding intersection point 19a can be given by the following equation (6):

$$\begin{bmatrix} c_{x1} \\ c_{x2} \end{bmatrix} = \begin{bmatrix} 1/A_1 - B_1/A_1 \\ 1/A_4 - B_4/A_4 \end{bmatrix}^{-1} \cdot \begin{bmatrix} 1 \\ 1 \end{bmatrix} \quad (6)$$

The other bonding intersection positions and lead intersection points are given by similar equations to the equation (6). Now letting fl be a function representing calculation of the equation (6), then the intersection points are obtained from the corresponding lines as follows:

The first bonding intersection point 19a=f1 (the first bonding line 16a, the fourth bonding line 16d).

The second bonding intersection point 19b=f1 (the second bonding line 16a, the fourth bonding line 16d).

The third bonding intersection point 19c=f1 (the second bonding line 16a, the third bonding line 16c).

The fourth bonding intersection point 19d=f1 (the first bonding line 16a, the third bonding line 16c).

The first lead intersection point 20a=f1 (the first lead line 17a, the fourth lead line 17d).

The second lead intersection point 20b=f1 (the second lead line 17b, the fourth lead line 17d).

The third lead intersection point 20c=f1 (the second lead line 17b, the third lead line 17c).

The fourth lead intersection point 20d=f1 (the first lead line 17a, the third lead line 17c).

The intersection points mean the vertexes of the rectangles as shown in FIG. 2(b).

The line arithmetic unit 21 calculates, based on these intersection points 19a to 19d, 20a to 20d, the first and second base bonding lines 22a, 22b and the first and second base lead lines 23a, 23b, these being the diagonals of the rectangles.

For example, letting $(C_{x1}, C_{y1})$ and $(C_{x3}, C_{y3})$ be X and Y coordinates of the first and third bonding intersection points, respectively, the first base bonding line 22a is expressed as $$y=(C_{x1}\cdot C_{y3}-C_{x3}\cdot C_{y1})/(C_{x1}-C_{x3})+x\cdot(C_{y1}-C_{y3})/(C_{x1}-C_{x3}) \quad (7)$$

The other base lines, letting f2 be a function representing the calculation of equation (7), are obtained by The second base bonding line 22b=f2 (The second bonding intersection point 19b, the fourth bonding intersection point 19d)

The first base lead line 23a=f2 (The first lead intersection point 20a, the third lead intersection point 20c).

The second base lead line 23b=f2 (The second lead intersection point 20b, the fourth lead intersection point 20d).

The base lines 22a, 22b; 23a, 23b are again put into intersection coordinate arithmetic section 18, and there the coordinate ($M_x$, $M_y$) of the intersection position, or base bonding position 27a, between the first and second base bonding lines, and the coordinate ($L_x$, $L_y$) of the intersection point, or base lead point 27b, between the first and second base lead lines are obtained. This calculation is carried out using the aforesaid function f1, as follows:

($M_x$, $M_y$)=f1 (the first base bonding line 22a, the second base bonding line 22b)

($L_x$, $L_y$)=f1 (the first base lead line 23a, the second base lead line 23b).

Figure 4:
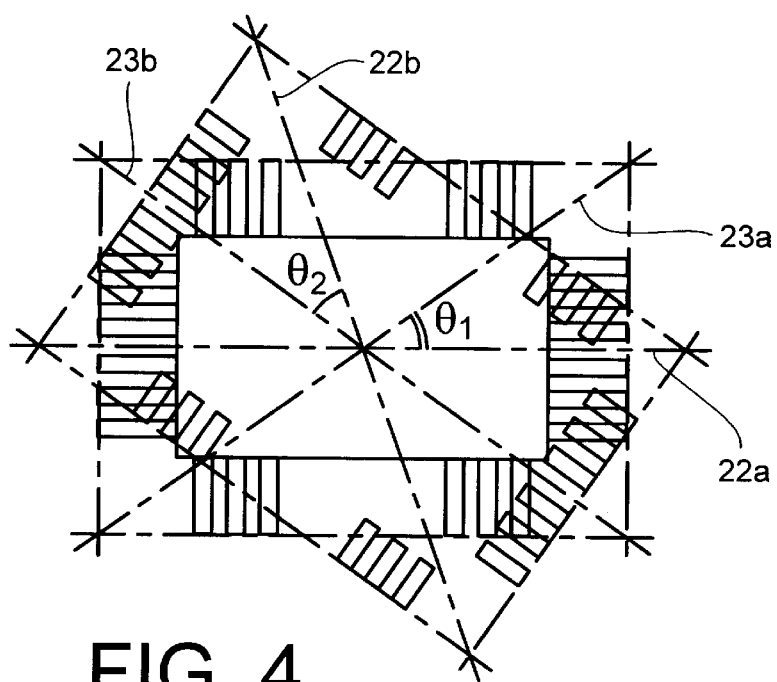
FIG. 4 is a schematic diagram for illustrating the intersection angles formed by the base lines of the electronic part and the printed circuit board.

The angle arithmetic unit 24 calculates the intersection angles $\theta_1$, $\theta_2$ between the first base bonding line 22a and the first base lead line 23a and between the second base bonding line 22b and the second base lead line 23b, respectively. See FIG. 4. This calculation is carried out as follows:

$$\theta_1=\tan^{-1}\{(C_{y1}-C_{y3})/(C_{x1}-C_{x3})\}+\tan^{-1}\{(K_{y1}-K_{y3})/(K_{x1}-K_{x3})\}$$

$$\theta_2=\tan^{-1}\{(C_{y2}-C_{y4})/(C_{x2}-C_{x4})\}+\tan^{-1}\{(K_{y2}-K_{y4})/(K_{x2}-K_{x4})\} \quad (8)$$

where ($C_{xn}$, $C_{yn}$) are the coordinates of the intersection position of the base bonding lines and ($K_{xn}$, $K_{yn}$) are the coordinates of the intersection points of the base lead lines as described above.

The above-mentioned intersection angles $\theta_1$ and $\theta_2$ are put into average-angle arithmetic section 26 and arithmetic average is obtained by $$\theta_e=(\theta_1+\theta_2)/2 \quad (9)$$

The error arithmetic unit 28 calculates corrective amounts $X_e$ and $Y_e$ in X- and Y-directions, respectively, corresponding to both distances according to $$X_e=L_x-M_x$$

$$Y_e=L_y-M_y. \quad (10)$$

The obtained $\theta_e$, $X_e$, and $Y_e$ are put into the operation section (not shown) which firstly performs correction of $X_e$ and $Y_e$ to align between the base bonding point 27a and base lead point 27b independent of the attraction position on the attraction arm, followed by correction of roration by corrective angle $\theta_e$, and then the electronic part is mounted on the p.c. board.

Figure 11A:
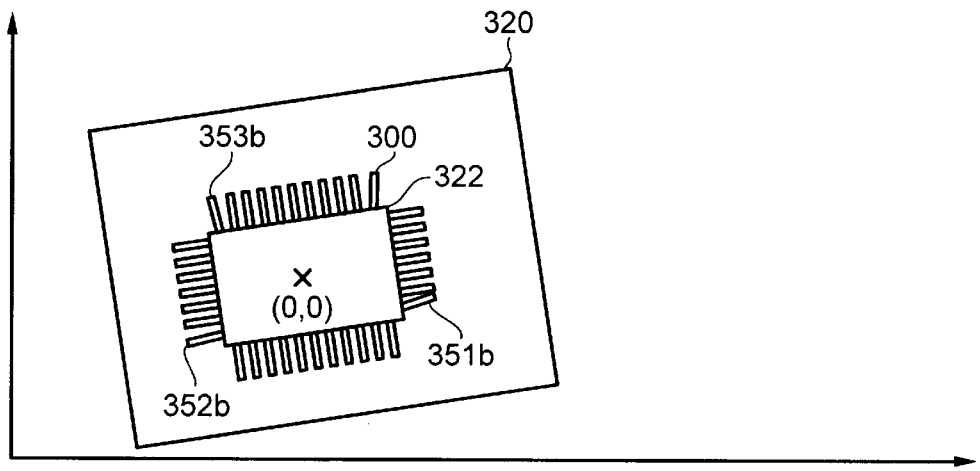
FIGS. 11(*a*) and 11(*b*) are a plan view of a certain electronic part having bent leads.
Figure 11B:
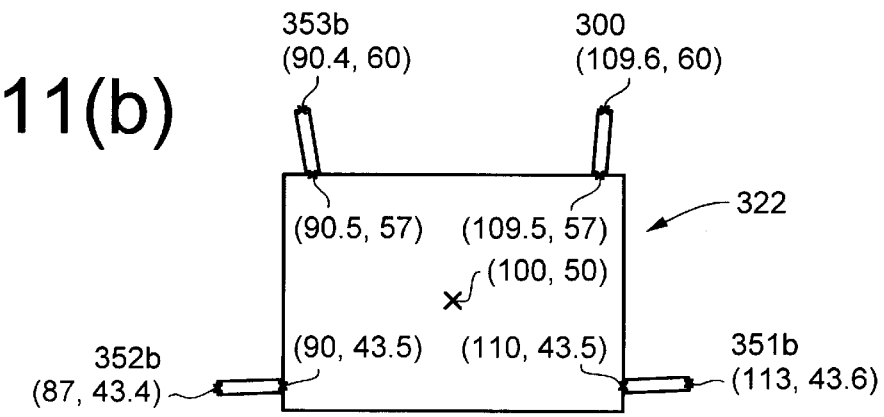

According to the above-described embodiment, for example, even if an electronic part has the leads some of which are deformed as shown in FIG. 11, mounting can be carried out without being affected by the deformation. Now assuming that any leads except the deformed leads shown in FIG. 11 is shaped as designed, the implementation system of electronic parts according to this embodiment will be free from extreme misalignment of the end lead 300 which has been observed in the conventional technique. In this case, the end lead 300 will be mounted at the coordinate (109.6, 60). Likewise, the first to third leads will be mounted at locations (113, 43.6), (87, 43.4), and (90.4, 60), respectively. Thus, any of them can be positioned within an allowable error range of 0.1 mm in respect to the corresponding bonding—position coordinate.

Figure 5:
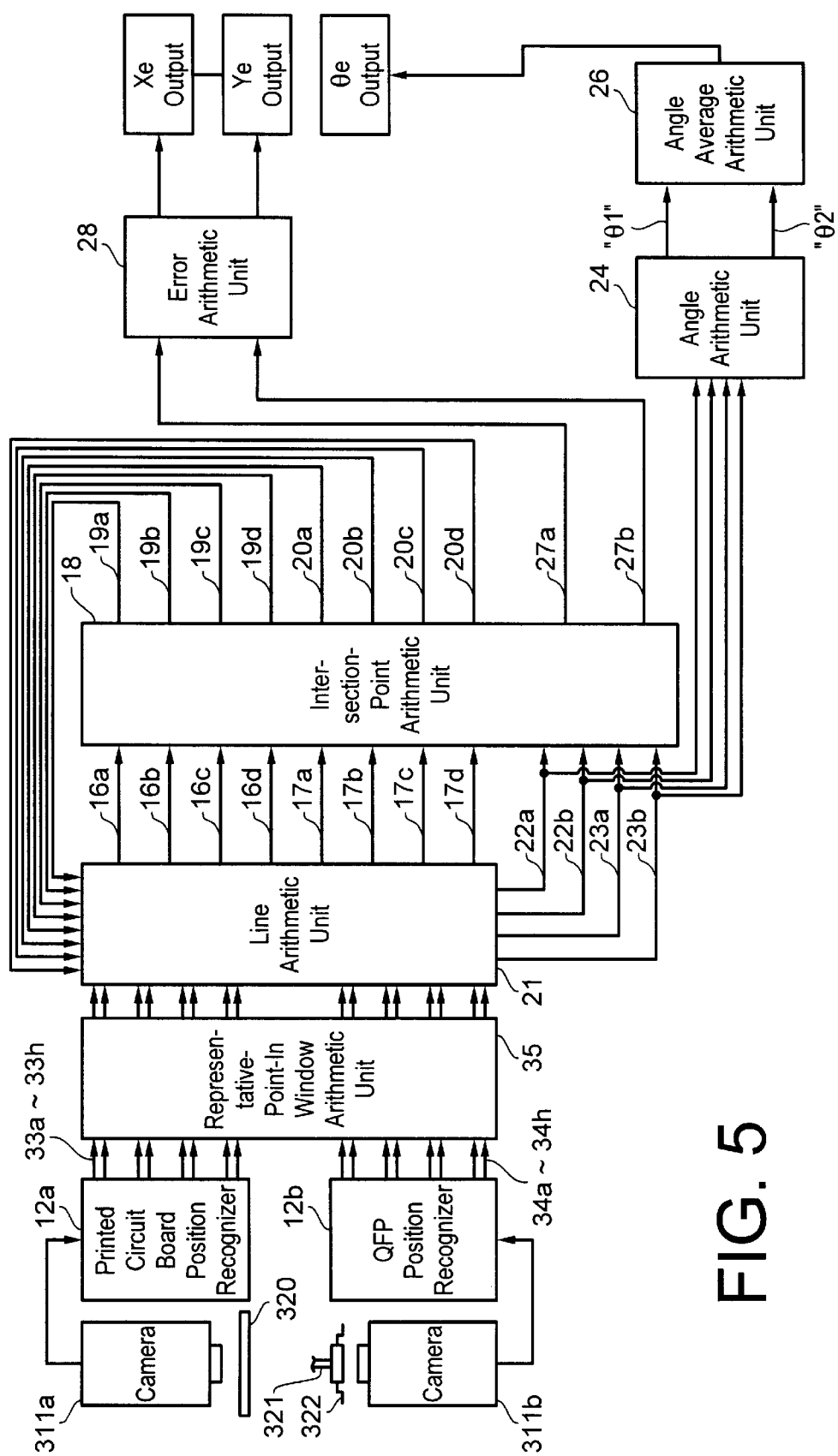
FIG. 5 is a block diagram of the construction of a mounting system for electronic parts according to a second embodiment of the present invention.

Reference is made to FIG. 5 which is a block diagram illustrating the construction of a mounting system for electronic parts as the second embodiment of the present invention. A QFP position recognizer 12b which is an arithmetic section for profile processing in the measurement window set for each lead row of an electronic part 322. Similarly a board-position recognizer 12a is an arithmetic unit for profile-processing the outer-end position of bonding pad 320. The outputs of both position recognizers 12a, 12b are put into a representative-point-in-window arithmetic unit 35. The other units, because of being the same in construction and function as those in the first embodiment, are designated by the same reference characters and their explanation is omitted.

Figure 6:
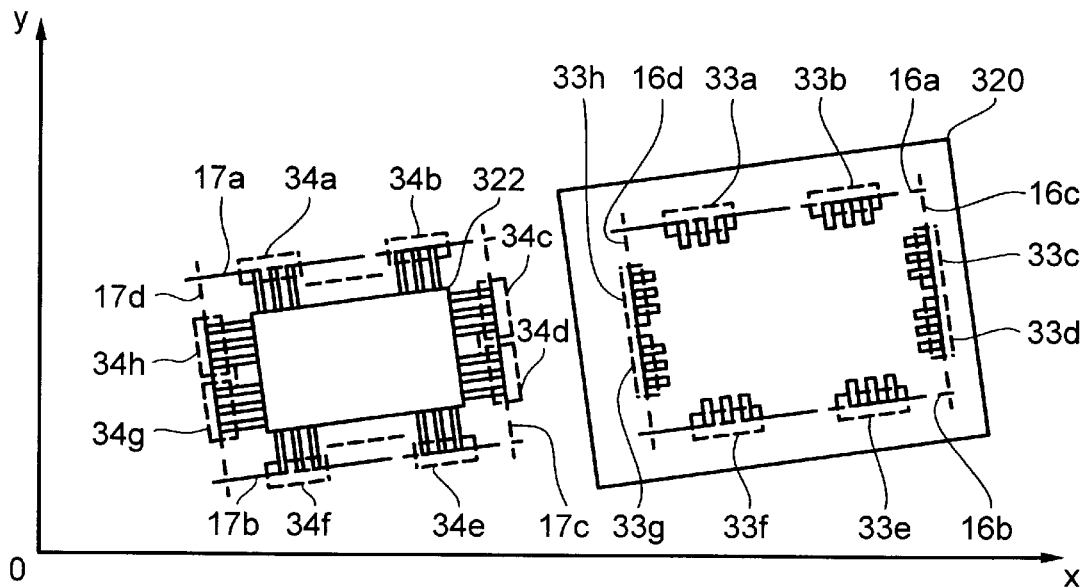
FIG. 6 is a plan view showing in detail an electronic part and a printed circuit board for illustrating the process of the embodiment of FIG. 5.
Figure 7:
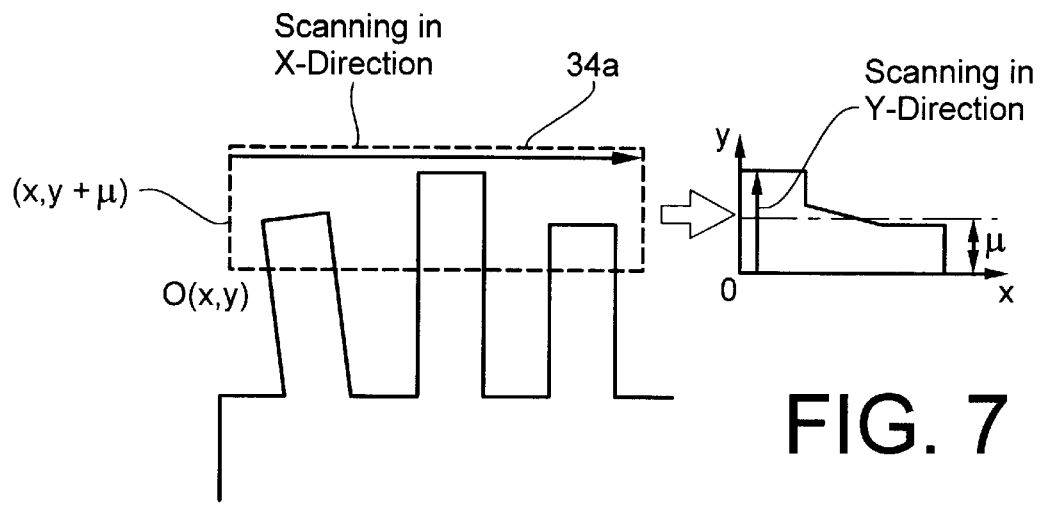
FIG. 7 is a schematic diagram for illustrating the profile processing in the embodiment of FIG. 5.
Figure 8:
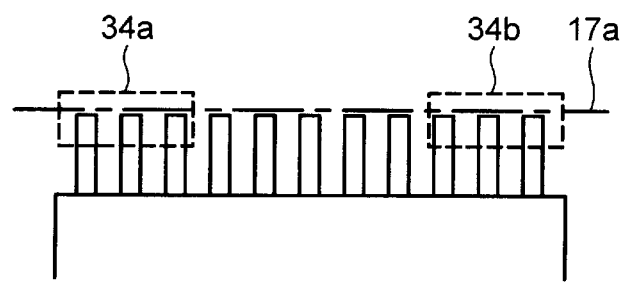
FIG. 8 shows schematic illustration of the calculation of the lines representing the lead rows.
Figure 9:
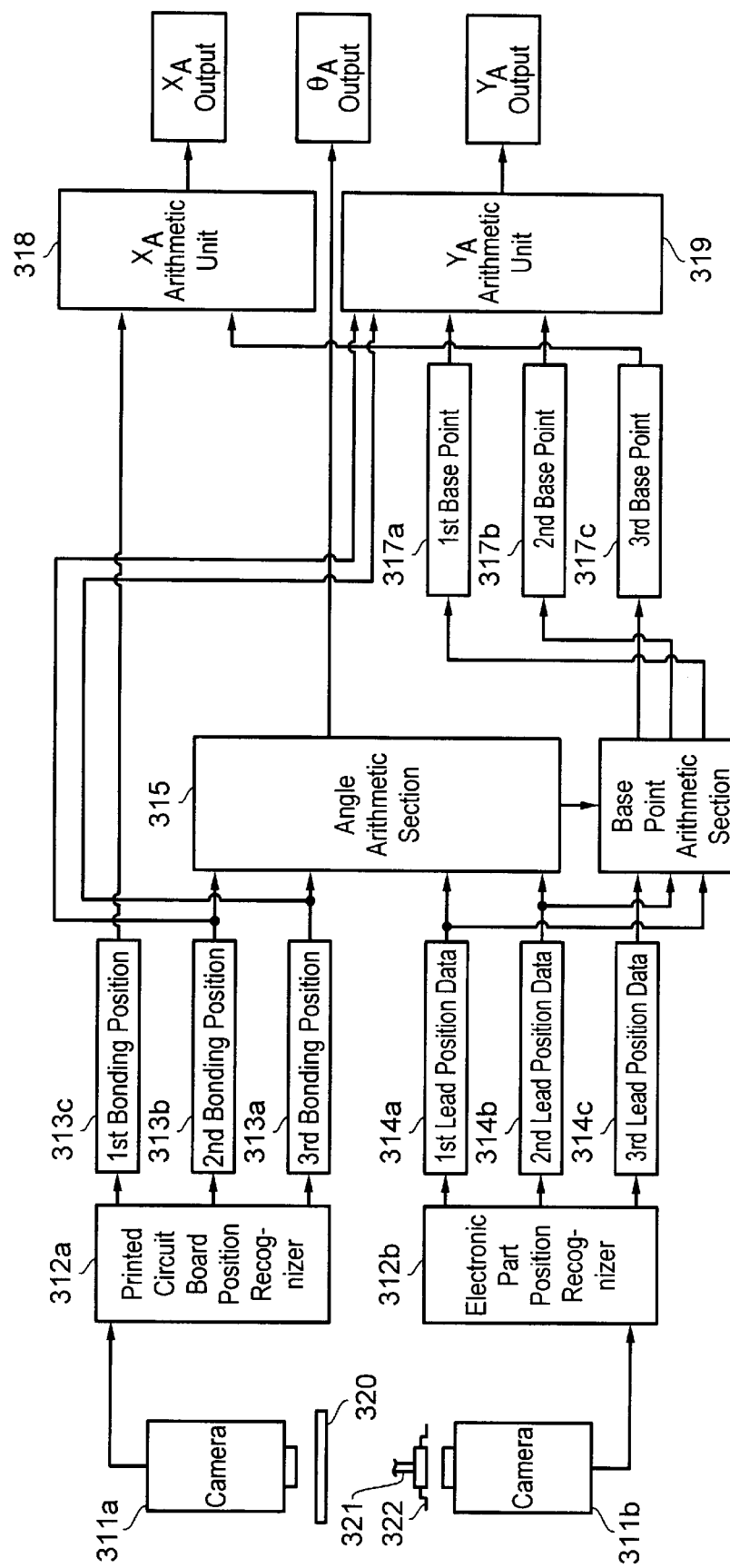
FIG. 9 is a block diagram of the construction of a conventional mounting system for electronic parts.
Figure 10:
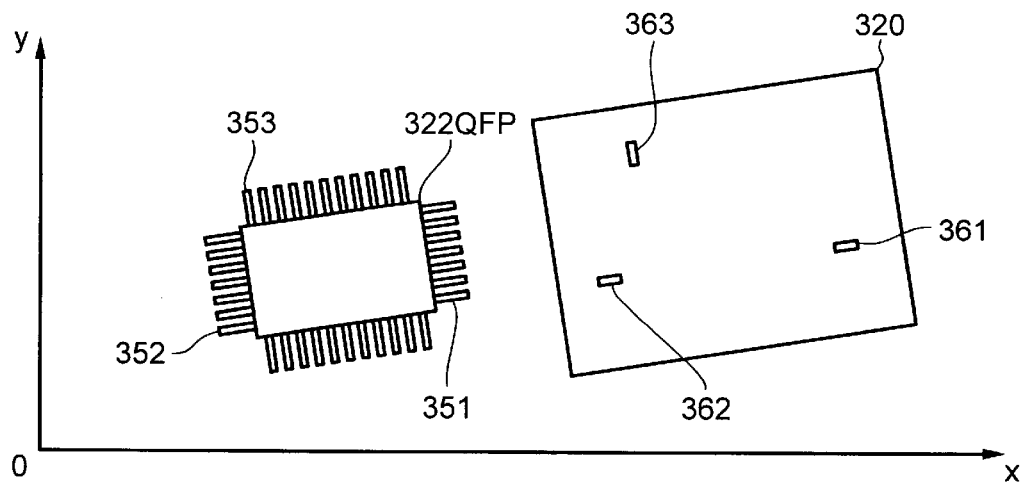
FIG. 10 is a plan view showing the optical images of an electronic part and a printed circuit board for illustrating the processing by the mounting system shown in FIG. 9.

FIG. 6 shows in plan the optical images of the printed circuit board and the electronic part to be processed for implementation performed by the implementation system of the second embodiment. FIGS. 7 and 8 are for illustrating the processing procedure. In FIG. 6, there is provided at each end of each side of electronic part 322 a measurement window including the free-end portions of a row of some leads. Similarly there is provided at each end of each side of p.c. board the corresponding measurement window including bonding pad portions. For example, the first and second windows 34a, 34b are provided at the ends of the same side, respectively.

The QFP position recognizer 12b scans in X-direction the first and second windows 34a, 34b and the fifth and sixth windows 34e, 34f on the opposite sides, respectively, to make the profile of the lead free-end-portion row in each window, and on the other hand in the Y-direction the third and fourth windows 34c, 34d and the seventh and eighth windows 34g, 34h on the opposite sides to make the profile including the free-end-portions of the lead row in each window. Likewise, the board position recognizer 12a scans each window in the board 320 to make the profile including the outer-end portions of the bonding pad row in the window. This manner is illustrated in FIG. 7.

The representative-point-in-window arithmetic unit 35 scans again the produced profile of each window supplied from position recognizers 12a, 12b, and calculates from this data the average value and standard deviation of each window. For example, the first, second, fifth, and sixth windows 34a, 34b, 34e, 34f of the electronic part 322 are again scanned in Y-direction along X-axis to calculate the average value $\mu$ of Y value and standard deviation $\sigma$. The coordinate (x, y+$\mu$), is regarded as the representative value of the lead free-end in the concerned window.

Furthermore the third, fourth, seventh, and eighth windows 34c, 34d, 34g, 34h of the electronic part 322 are similarly scanned in X-direction along Y-axis to calculate the average value $\mu$ of X-value and standard deviation a. The coordinate (x+$\mu$, y), this X-component being the addition of the average value $\mu$ to the X-component of the origin O (x, y), is regarded as the representative value of the lead free-end in the concerned window. If however there is data of above ($\mu$+3$\sigma$), they are excepted, and the average value is calculated again.

As described above, the representative-point-in-window arithmetic unit 35 calculates the representative value of the lead free-end or bonding-pad outer-end in each window of the electronic part 322 or the board 320, and put into line arithmetic section 21 which calculates the line representing the characteristic of the row of lead free-end portions or bonding-pad outer-end portions from the representative point coordinates of two windows on the same side. This procedure of calculation is the same as described in the preceding embodiment. In FIG. 8, the first lead line 17a calculated from windows 34a, 34b is shown as an example.

The other bonding lines and lead lines are defined by combination of the representative values of the windows: As shown in FIG. 6, in p.c. board 320, the first bonding line 16a is specific for the first and second bonding windows 33a, 33b, the second bonding line 16b for the third and fourth bonding windows 33c, 33d, and the third bonding line 16c by the fifth and sixth bonding windows 33e, 33f. In electronic part, the second lead line 17b is specific for the third lead window 34c and the fourth lead window 34d, the third lead line 17c for the fifth lead window 34e and the sixth lead window 34f, and the fourth lead line 17d for the seventh lead window 34g and the eighth lead window 34h.

In the second embodiment, for replacement of calculation of regression line in the preceding embodiment, the lead line or bonding line is calculated from the average value of the free-end portions of the lead row or the outer end positions of bonding pad row at each end on each side. Adoption of such construction is due to that with a large, multi-pin, fine-pitch electronic part, the resolving power of camera can not follow it, resulting in occurrence of a moire phenomenon which makes it impossible to recognize individual lead or bonding pad. There is no need for the profile processing as described above to recognize individual lead or bonding pad, and therefore it is sufficient merely to scan the positions of free-ends or outer ends.

After obtaining bonding lines and lead lines by the line arithmetic unit 21, the processing proceeds in entirely the same way as in the preceding embodiment, i.e., intersection-point arithmetic unit 18 calculates the intersection points between the bonding lines and the lead lines, respectively. From these intersection points, base lines constituting diagonal lines and base points which are the intersection points between the base lines are obtained in sequence. In the same way as the preceding embodiment, corrective angle $\theta_e$ and corrective amounts $x_e$, $y_e$ are obtained.

The mounting system for electronic parts as the second embodiment can accomplish the precise mounting especially for large, multi-pin, fine-pitch electronic parts by selection of suitable windows without lowering the processing speed.

In the above-described embodiments, the four representative lines are calculated which, respectively, represent the characteristic of the free-end or outer-end portions of each lead row or bonding-pad row. Subsequently four intersection points created by these representative lines are joined between opposed two to form two diagonal lines. The two resulting diagonal lines and the inter-section point between these are used as base lines and base point for the electronic part and the p.c. board, respectively. Thus irrespective of deformation, such as inclination, of lead free-end portions, wholly-precise base points and base lines are calculated, and hence more precise implementation is possible as compared with the system using base lines and base points defined in respect to specific leads as in the conventional technique. Furthermore it is not always needed to select diagonal lines and intersection point between them as base lines and base point. For example, lead lines and bonding lines are calculated from rows of leads and the corresponding rows of bonding points on two adjacent sides, and thus-obtained two lead lines and two bonding lines may be selected as base lines of the electronic part and p.c. board. In addition, the intersection points between the lead lines and between the bonding lines may be used as base points of the electronic part and p.c. board.

The base lines and base points selected from lead lines and bonding lines are affected by deformation of leads and/or positional misalignment on bonding to such an reduced extent that they can better indicate the angle and alignment relation between the electronic part and the p.c. board.

The present invention has been described by way of preferred embodiments. The construction of the invention may be allowed to be variously modified and changed. It is not contemplated to be construed to limit the present invention to the above-described embodiments only.

What is claimed is:

1. A mounting system for mounting an electronic part on a mounting body by aligning leads of said electronic part with corresponding bonding terminals of said mounting body, said leads being arranged on four sides of said electronic part, said system comprising:

positional-data forming means for forming positional data of said leads and said bonding terminals;

line arithmetic means for calculating, from said positional-data, lead lines representing rows of said leads of said electronic part and bonding lines corresponding to said lead lines and representing rows of said bonding terminals;

base-point/base-line arithmetic means for calculating base points and base lines of said electronic part and of said mounting body, said base lines being calculated as diagonal lines of a rectangle defined by said four sides, and said base point being calculated as an intersection point between said diagonal lines of said rectangle;

position/angle arithmetic means for calculating positional-interrelationship between base points of said electronic part and said mounting body and intersection angles between the base lines of said electronic part and said mounting body; and position/angle control means for controlling interrelationship in position and angle between said electronic part and said mounting body based on said positional interrelationship and said intersection angles.

2. The mounting system as claimed in claim 1, wherein said line arithmetic means calculates said lead lines and said bonding lines as regression lines of said lead positions and said bonding terminals, respectively.

3. A mounting system for mounting an electronic part on a mounting body by aligning leads of said electronic part with corresponding bonding terminals of said body, said leads being arranged on four sides of electronic part, said system comprising:

positional data forming means for forming positional data of said leads and said bonding terminal;

regression line arithmetic means for calculating lead lines and bonding lines as regression lines of said lead positions of said electronic part and of said bonding terminals of said mounting body, respectively;

intersection point coordinate arithmetic means for calculating intersection points between said regression lines of said electronic part and of said mounting body;

line arithmetic means for calculating, based on said intersection points, first and second base bonding lines of said mounting body and said first and second base lead lines of said electronic part, said first and second base bonding lines and said first and second base lead lines being calculated as diagonal lines of a rectangle defined by said four sides and of diagonal lines of a corresponding rectangle formed by said bonding pads, respectively;

angle arithmetic means for calculating intersection angles between said first base bonding line and said first base lead line, and for calculating intersection angles between said second base bonding line and said second base lead line, respectively;

position/angle control means for controlling, in position and angle, said electronic part and said mounting body based on a positional interrelationship between said base points of said electronic part and said mounting body and said intersection angles calculated by said angle arithmetic means.

4. A mounting system according to claim 3, further comprising an average angle arithmetic means for calculating an average of said intersection angles obtained from said angle arithmetic means.

5. A mounting system according to claim 4, further comprising an arithmetic means for aligning said electronic part with said mounting body by first calculating corrective data to align base bonding points formed by an intersection of said first and second base bonding lines with base lead points formed by an intersection of said first and second lead lines, and then by rotating one of said electronic part and said mounting body by an angle equal to said average angle obtained by said average angle arithmetic means.

6. A mounting system for mounting an electronic part on a mounting body by aligning leads of said electronic part with corresponding terminal of said mounting body, said lead being arranged on four sides of said electronic part, said system comprising:

position recognizer and arithmetic means for recognizing a position and for profile processing a measurement window for each lead row of said electronic part and for profile processing a measurement window for each row of bonding terminals on said mounting body;

representative point in window arithmetic means for scanning said profile of each window supplied from said position recognizer and arithmetic means and for calculating representative point coordinates of a lead free end and of a bonding pad outer end of each window of said electronic part and of said mounting body, respectively;

line arithmetic means for calculating lines representing a characteristic of each row of lead free end and each corresponding row of bonding pad outer end from said representative coordinates generated by said representative point in window arithmetic means;

intersection point arithmetic means for calculating intersection points between said lines output from said line arithmetic means and for calculating base intersection points as intersections of diagonal lines of a rectangle defined by said four sides and of diagonal lines of a corresponding rectangle formed by said bonding pads, respectively;

position/angle arithmetic means for calculating a positional interrelationship between said intersection points of said electronic part and of said mounting body and between said base intersection points of said electronic part and of said mounting body, said position/angle arithmetic means also calculating intersection angles between said lines representative of said free end and outer end of each lead row and bonding pad row, respectively; and position/angle control means for controlling interrelationship and position and angle between said electronic part and said mounting body based on said positional relationship and said intersection angles.

7. A mounting system according to claim 6, wherein said representative point in window arithmetic means calculates an average value and a standard deviation of each window, said average value and standard deviation being used to calculate said representative coordinates.

* * * * *